United States Patent [19]
Kaminishizono et al.

[11] Patent Number: 5,647,912
[45] Date of Patent: Jul. 15, 1997

[54] PLASMA PROCESSING APPARATUS

[75] Inventors: Takahiro Kaminishizono; Takeshi Akimoto, both of Tokyo, Japan

[73] Assignee: NEC Corporation, Tokyo, Japan

[21] Appl. No.: 617,731

[22] Filed: Apr. 1, 1996

[30] Foreign Application Priority Data

Mar. 31, 1995 [JP] Japan .................................. 7-075105

[51] Int. Cl.$^6$ ....................................... C23C 16/00
[52] U.S. Cl. ........................... 118/719; 118/723 E
[58] Field of Search .................... 118/719, 723 E, 118/723 ER; 156/345; 204/298.35, 298.26, 298.11; 313/231.31; 315/111.21

[56] References Cited

FOREIGN PATENT DOCUMENTS 368136  3/1991  Japan .

*Primary Examiner*—John Niebling
*Assistant Examiner*—Joni Y. Chang
*Attorney, Agent, or Firm*—Sughrue, Mion, Zinn, Macpeak & Seas

[57] ABSTRACT

A permeable container having a plurality of holes whose diameters are equal to or less than two times the sheath length is provided in a vacuum container. provided at the bottom of this permeable container is an electrode on which an object to be processed is to be placed. A high-frequency power supply is connected to this electrode, and the permeable container is grounded. The permeable container and the electrode are insulated from each other by an insulator. When a process gas supplied into the vacuum container is guided into the permeable container through its holes and a high-frequency voltage is applied to the electrode, plasma is produced in the permeable container. Because the diameters of the holes are equal to or less than two times the sheath length, plasma is trapped inside the permeable container, thus improving the stability and density of plasma. This invention can therefore prevent plasma from becoming non-uniform and unstable and having a lower density, which, if occurred, raise a problem in the plasma process in a low-pressure area, and can efficiently trap plasma, thus ensuring uniform and high-density plasma on the to-be-processed object.

12 Claims, 4 Drawing Sheets

PLASMA PROCESSING APPARATUS

BACKGROUND OF THE INVENTION

1. Field of the Invention

The present invention relates to a plasma processing apparatus which performs fine processing of various kinds of semiconductor devices, like LSIs, and thin film devices using discharged plasma.

2. Description of the Related Art

One of conventional plasma processing apparatuses is a parallel plate type apparatus which causes a high-frequency power supply discharge between two facing electrodes. FIG. 1 shows a conventional plasma processing apparatus described in Unexamined Japanese Patent Publication No. Hei 3-68136. Two facing electrodes 31 and 32 are disposed inside a vacuum container 1. The electrode 31 is provided on the top of a shaft standing upright at the bottom portion of the vacuum container 1 via an insulator 34, with its surface parallel to the shaft's top. The electrode 32 is provided on the bottom end of a shaft suspending upright from the top wall of the vacuum container 1 via an insulator 35, with its surface parallel to the shaft's bottom end. A connecting section of a gas intake pipe 4 is provided at the upper potion of one side wall of the container 1, and a connecting section of a gas exhaust pipe 5 is provided at the bottom wall of the container 1. One of the two electrodes, 32, is grounded, and the other electrode 31 is connected to a high-frequency power supply 6. The pressure inside the container 1 is set to a predetermined level by guiding gas into the container 1 via the gas intake pipe 4, discharging the gas from the container 1 via the gas exhaust pipe 5 and adjusting the gas supply speed and gas discharge speed. A high-frequency voltage is then applied between the electrodes 31 and 32 to generate plasma to perform a plasma process on a to-be-etched substrate 2 which is placed on the electrode 31.

For example, the substrate 2 to be etched is placed on the high-frequency electrode (31) side in the vacuum container 1, and an etching gas 41 is supplied from the other electrode (32) side via the gas intake pipe 4. With the pressure in the vacuum container 1 kept at the vacuum pressure of 0.3 to 1.0 Torr by discharging the gas from the gas exhaust pipe 5, high-frequency power is applied between the electrodes 31 and 32 by the high-frequency power supply 6, thus producing plasma. A negative self-bias voltage is produced on the electrode side to which the high-frequency voltage is applied, and ions accelerated by the negative bias enter the to-be-etched substrate 2 so that anisotropic etching is performed on the substrate 2.

Because the electrodes of this apparatus have a parallel plate type structure, a voltage Vdc can be applied to the to-be-processed substrate 2 uniformly over the surface thereof. This ensures uniform ion energy to be incident to the surface of the to-be-processed substrate, so that uniform plasma processing is accomplished.

Another parallel plate plasma processing apparatus uses the electrode 32 which has a plurality of gas outlet holes 32a as a ground electrode, and is disposed to face the electrode 31 on which the to-be-processed substrate 2 is to be placed, as shown in FIG. 2. As the electrode 32 having the gas outlet holes 32a has a hollow support shaft 40 in which a process gas 41 is supplied so that the process gas is injected into the container 1 from the holes 32a. Therefore, the connection portion for the attachment of the gas intake pipe 4 is not provided on the side wall of the container 1.

The use of the electrode 32 having such gas outlet holes ensure the uniform flow of the gas to be supplied to the to-be-processed substrate 2, thus further improving the uniformness of the plasma processing of the to-be-processed substrate 2. Because of their simple structures as is apparent from FIGS. 1 and 2, the illustrated apparatuses are widely used today.

According to those conventional apparatuses, the collision of radicals with ions bends the incidence of the ions to provide a plasma distribution in the ion incident direction. It therefore becomes difficult to process a fine pattern with the size of a sub micron order. To cope with the difference in size conversion caused by the oblique incidence of ions, it is inevitable to reduce the discharge pressure and align the ion incident directions. This is because that the low pressure increases the means free path of ions, so that the probability of collision of radicals with ions becomes smaller and the ion incident directions are aligned, causing the ions to be incident perpendicularly. In the low pressure area, however, plasma is likely to spread in the chamber, causing unstable discharge and making it difficult to trap the plasma. Naturally, the plasma density becomes lower, so that a sufficient processing speed cannot be obtained.

Recently, a narrow-electrode type parallel plate plasma processing apparatus is also used which traps plasma between the electrodes to improve the plasma density on the object to be processed, thus increasing the plasma processing speed.

The aforementioned Unexamined Japanese Patent Publication No. Hei 3-68136 discloses the method of acquiring high-density plasma even in a low-pressure area by using a hollow electrode. The structure of this apparatus is illustrated in FIG. 3. This apparatus has a ground electrode 32 provided at the upper end of the support shaft which stands upright at the bottom of a vacuum container 1 via an insulator 90. A substrate 2 to be processed is to be placed on this ground electrode 32. Disposed above the ground electrode 32 in parallel thereto is a high-frequency electrode 31. This high-frequency electrode 31 has a center hole 33.

A gas intake pipe 4 is supported, perpendicular along its lengthwise direction, in the top wall of the container via an insulator 93. A hollow electrode 7 is provided at the lower end of the gas intake pipe 4, with its opening facing downward. Attached to the midway of the gas intake pipe 4 via an insulator 91 is a cylindrical anode or positive electrode 8 whose lower end is open and which hangs perpendicularly along its lengthwise direction. One of the aforementioned parallel plate type electrodes, 31, is attached via an insulator 92 to the lower end of the positive electrode 8. The electrodes 31 and 32 are connected via a switch 12 to a high-frequency power supply 6. A negative voltage supply 61 is connected to the gas intake pipe 4, so that a negative voltage is applied to the hollow electrode 7.

As a DC voltage which is negative on the hollow electrode (7) side is applied between the hollow electrode 7 and opposing electrodes 31 and 32 in this conventional apparatus, plasma discharge occurs locally in the hollow electrode 7 into which the etching gas is supplied via the gas intake pipe 4, and the discharge is trapped in the hollow electrode 7 so that high-density plasma is produced. The power supply from the high-frequency power supply 6 also generates plasma between the opposing electrodes 31 and 32. The plasma in the hollow electrode 7 is supplied via the hole 33 between the parallel plate electrodes 31 and 32 to be put over the plasma that has been produced between the parallel plate electrodes 31 and 32. Consequently, high-density plasma can be obtained. This is a triode type method.

The above-described processing apparatuses all have the following shortcoming. The conventional apparatuses, which execute plasma processing using the electrodes whose distance therebetween is shortened, increase the plasma density and enhance the etching speed. But, the etching gas and reaction product are discharged around, so that the density differs between the center portion and the peripheral portion of the object to be processed. In addition, because of the narrow gap between the electrodes, the parallelism of the two electrodes affects the uniformity of the electric field. It therefore difficult to acquire uniform plasma over the to-be-processed object.

Moreover, while the aforementioned triode type RIE or the like which has been proposed to obtain high-density plasma can locally acquire high-density plasma, the plasma is carried over the surface of the to-be-processed object by diffusion so that the substantial plasma density is insufficient over the object's surface.

SUMMARY OF THE INVENTION

Accordingly, it is an object of the present invention to provide a plasma processing apparatus which can uniformly and stably generate plasma, which becomes non-uniform and unstable as the pressure falls, with a high density and which can prevent the influence of the flow of gas.

A plasma processing apparatus according to this invention comprises:

- a first container having a gas intake portion and a gas exhaust portion;
- a second container disposed within the first container and having a plurality of holes for permeability;
- a first electrode constituting a part of the second container, an object to be processed being placed on the first electrode; and
- voltage applying means for applying a high-frequency voltage between the first electrode and the second container.

In this case, it is desirable that the holes have diameters equal to or less than two times a sheath length of plasma to be produced.

In a parallel plate plasma processing apparatus according to this invention, the entire surface of the first electrode for holding a wafer is covered with a second container (electrode) having a plurality of holes for permeability to define given space in the vicinity of the surface of the first electrode. As a result, plasma is trapped in that space, so that the stability, uniformity and density of plasma can be improved, thus ensuring etching at a high etching rate and with high selectivity and high uniformity.

According to this invention, therefore, the electrode structure of a parallel plate plasma processing apparatus is modified to generate uniform, stable and high-density plasma under low pressure, so that anisotropic plasma processing, which cause less ion-originated damages, can be carried out at a high etching rate and with high selectivity and high uniformity.

DETAILED DESCRIPTION OF THE PREFERRED EMBODIMENT

Figure 1:
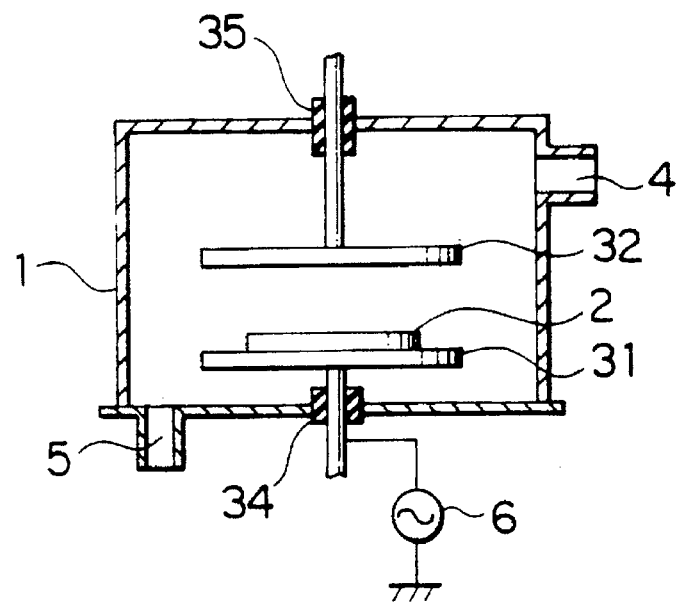
FIG. 1 is a cross-sectional view showing a conventional parallel plate plasma processing apparatus.
Figure 2:
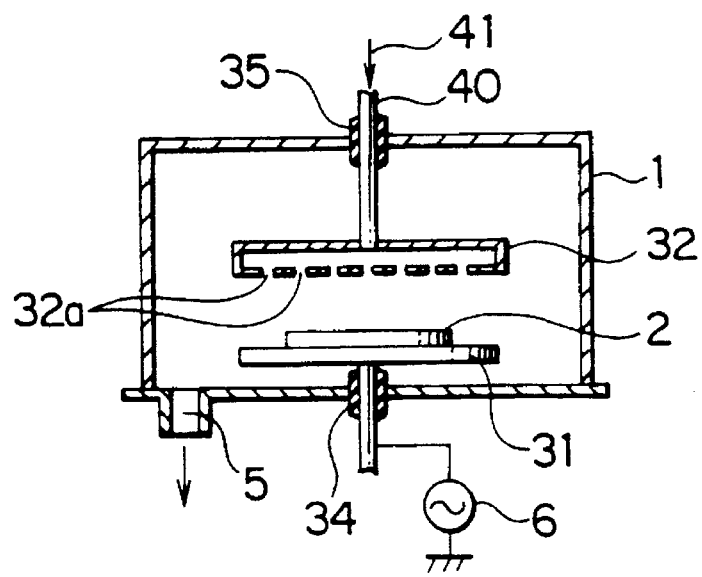
FIG. 2 is a cross-sectional view showing another conventional parallel plate plasma processing apparatus.
Figure 3:
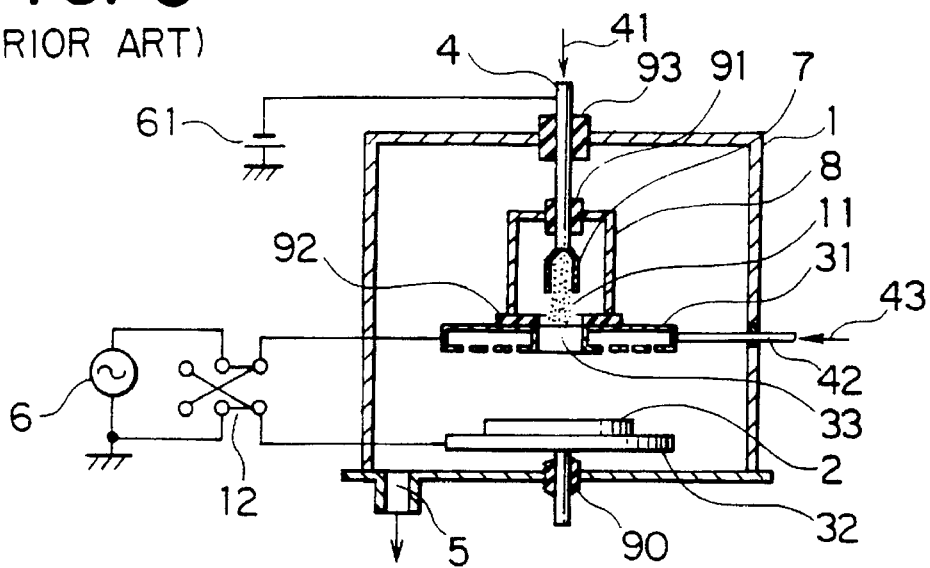
FIG. 3 is a cross-sectional view of a conventional triode type apparatus.
Figure 4:
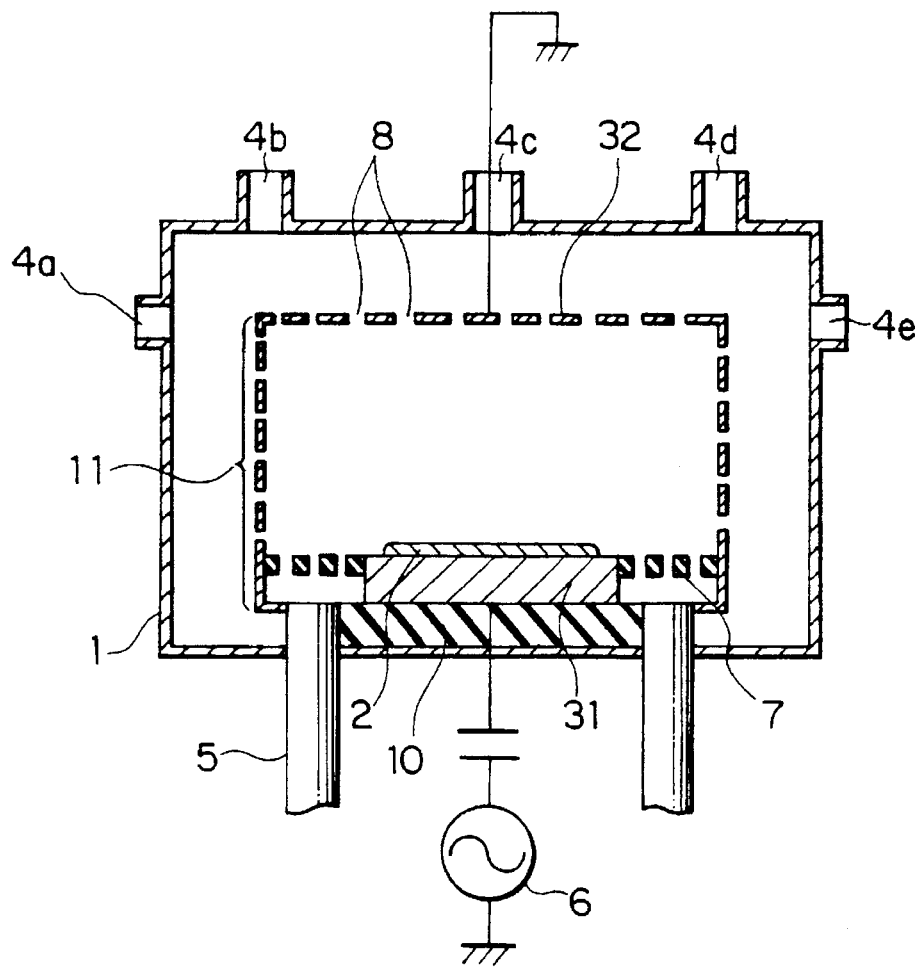
FIG. 4 is a cross-sectional view illustrating the first embodiment of the present invention.

FIG. 4 presents an exemplary cross-sectional view illustrating the first embodiment of this invention. An electrode 31 is disposed inside and on the bottom of a vacuum container 1, with its surface set horizontally. A box-like container 11 is disposed in the vacuum container 1 in such a way that the electrode 31 is positioned at the bottom of the container 11. The container 11 has multiple holes 8 formed therein for permeability between its interior and exterior. The bottom of the container 11 is made of an insulator 7. The container 11 containing the insulator 7 defines one space together with the electrode 31. The electrode 31 is connected to a high-frequency power supply 6, and a substrate 2 to be processed is to be placed on the electrode 31. Further, the container 11 is grounded. An exhaust pipe 5 is provided at the bottom of the vacuum container 1, and the upper exhaust port of the exhaust pipe 5 is located inside the container 11. Provided at the side walls and the top wall of the vacuum container 1 are gas inlet portions 4a, 4b, 4c and 4d to which gas intake pipes are connected.

The operation of the thus constituted plasma processing apparatus according to this embodiment will now be described. This container 11, which surrounds the space in contact with the surface of the to-be-processed substrate 2 placed on the electrode 31, is also grounded to serve as a ground electrode. As the container 11 is formed with multiple holes 8, it has permeability so that a process gas supplied inside the vacuum container 1 via the gas inlet portions 4a to 4e is guided via the holes 8 into the container 11 and is discharged from the exhaust pipe 5 which has an inlet port inside the container 11.

The pressure of the process gas in the vacuum container 1 is adjusted by controlling the gas supply speed and discharge speed, and high-frequency power is applied to the electrode 31 by the high-frequency power supply 6. As a result, plasma is produced in the container 11 which serves as a ground electrode 32.

Because the surfaces of the electrode 31 and the to-be-processed substrate 2 are covered by the container 11, this embodiment has such an advantage that plasma, which conventionally expands outward from the electrode, is trapped in a given area. This advantage allows the plasma density to be increased and plasma to become uniform over the surface of the to-be-processed substrate 2. It is therefore possible to improve the etching speed, selection ratio and etching uniformity of the to-be-processed substrate 2.

The exhaust pipe 5 is provided directly under the insulator 7, and a plurality of gas intake pipes 4 are provided on the walls of the vacuum container 1 to supply an etching gas. Although the illustrated embodiment supplies the etching gas inside the vacuum container 1, the etching gas may be directly supplied into the container 11.

According to this invention, a plurality of holes 8 whose diameters are equal to or smaller than two times the sheath length of the plasma to be produced are formed in the container 11 excluding where the electrode 31 is located. The supply and discharge of the etching gas through the holes 8 can be carried out inside the container 11.

The conventional parallel plate etching apparatus supplies gas through gas outlet holes provided in the upper electrode and discharges the gas from around the sample table, whereas this embodiment supplies gas inside the vacuum container 1 and supplies the gas inside the container 11 from a plurality of holes formed therein so that uniform supply of the etching gas to the to-be-processed substrate 2 is possible. As the diameters of the holes 8 are equal to or smaller than two times the width of the sheath produce near the surface of the cathode or negative electrode (ground electrode 32). Even multiple holes 8 are bored through the electrode 32 and insulator 7, therefore, it is possible to prevent plasma from leaking outside from the container 11 and prevent the plasma density from dropping or plasma from becoming non-uniform.

Figure 5:
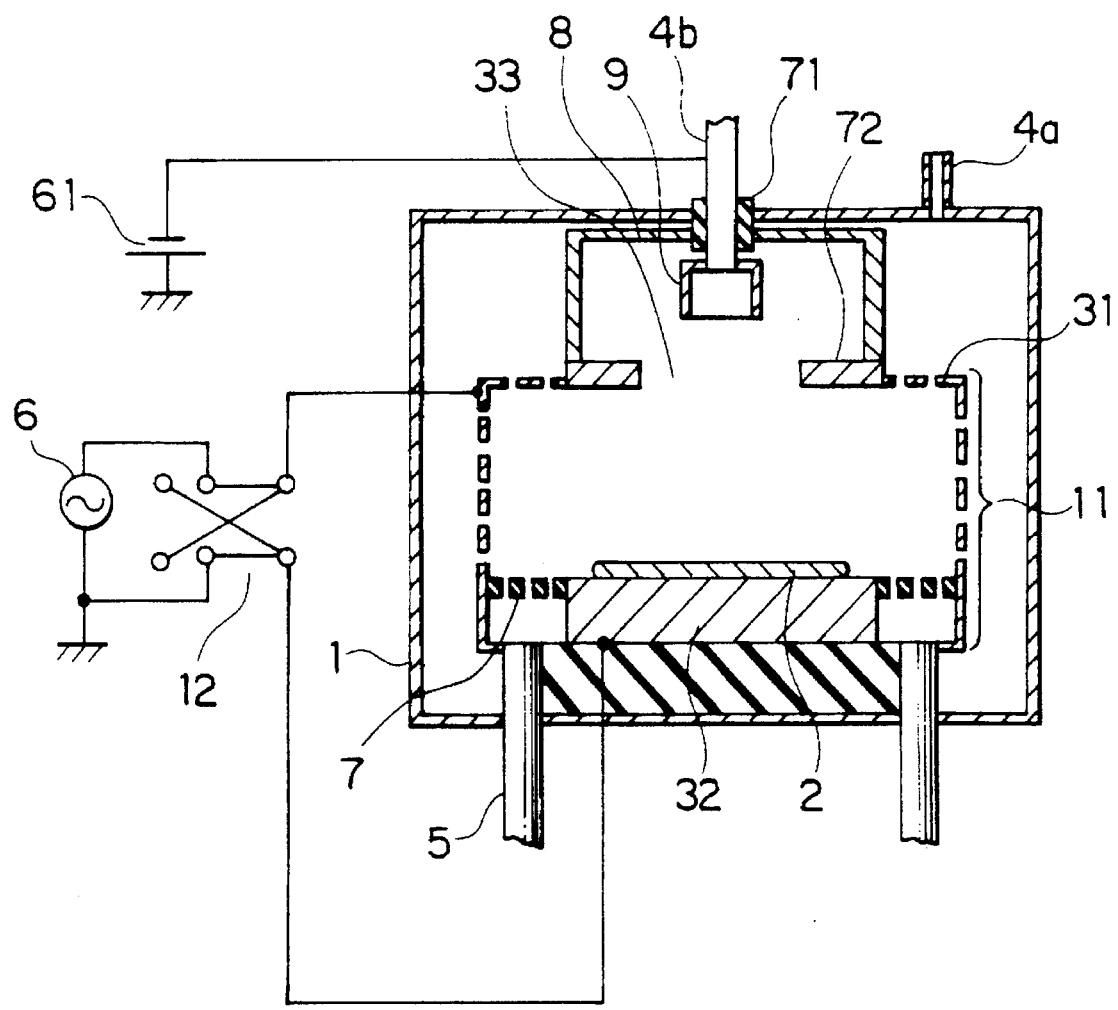
FIG. 5 is a cross-sectional view illustrating the second embodiment of the present invention.

FIG. 5 presents an exemplary cross-sectional view illustrating a plasma processing apparatus according to the second embodiment of this invention. This embodiment is an example of the invention as adapted for triode RIE. Disposed in a vacuum container 1 are a ground electrode 32 which also serves as the support of a substrate 2 to be etched, a container 11 which, together with this ground electrode 32, defines one space in the vicinity of the surface of the ground electrode 32, and an insulator 7 which insulatively separates the container 11 from the electrode 32. A high-frequency power supply 6 is connected between the electrode 32 and the container 11 11 via a switch 12. The container 11 therefore serves as a high-frequency electrode 31. Multiple holes 8 are formed in the container 11 so that the container 11 has permeability, allowing the process gas supplied into the vacuum container 1 to be guided into the container 11.

A gas intake pipe 4b is supported vertically in the top wall of the vacuum container 1 via an insulator 71, and a hollow electrode 9 is provided at the lower end of the gas intake pipe 4b with its opening facing downward. A cylindrical electrode 8 is fitted over the gas intake pipe 4b via the insulator 71, with its opening facing downward. Provided at the lower opening of the cylindrical electrode 8 is a ring-shaped insulator 72 whose hole is concentric to the cylindrical electrode 8. Therefore, the hole of the insulator 72 serves as an opening 33 of the cylindrical electrode 8. The cylindrical electrode 8 is securely coupled to a container 31 (high-frequency electrode 31) via this insulator 72. The cylindrical electrode 8 is larger in diameter than the hollow electrode 9, and is insulated from the hollow electrode 9 by the insulator 71. The cylindrical electrode 8 is provided concentric to the hollow electrode 9 in such a way as to surround the latter electrode 9. The hollow electrode 9 is applied with a negative voltage by a negative voltage supply 61 so it becomes a negative electrode, and the cylindrical electrode 8 insulated from the hollow electrode 9 becomes a positive electrode.

The operation of the thus constituted plasma processing apparatus according to the second embodiment will now be described. When a negative voltage is applied to the hollow electrode 9 by the negative voltage supply 61, the cylindrical electrode 8 becomes a positive electrode, and a DC voltage is applied between the cylindrical electrode 8 and the hollow electrode 9 as a negative electrode, causing discharge. When high-frequency power is applied to the electrode 31 (container 11) by the high-frequency power supply 6, discharge occurs between the electrode 31 and the grounded electrode 32. The discharge which has occurred near the distal end of the hollow electrode 9 is controlled by controlling the DC voltage which is applied to the hollow electrode 9 by the negative voltage supply 61, while the discharge which has occurred in the container 11 is controlled by controlling the high-frequency power which is applied by the high-frequency power supply 6. Apparently, the plasma produced by the discharge occurring near the distal end of the hollow electrode 9 in the cylindrical electrode 8 and the plasma produced by the discharge occurring in the container 11 are independent of each other. Those two plasmas are carried to the to-be-processed substrate 2 by diffusion to perform a plasma process on the substrate 2.

The adaptation of this invention to a triode can trap plasma, which normally spreads in the vacuum container 1, between the high-frequency electrode 31 and the ground electrode 32, thus preventing the reduction of the plasma density and non-uniform plasma from occurring the spreading of the plasma.

Figure 6:
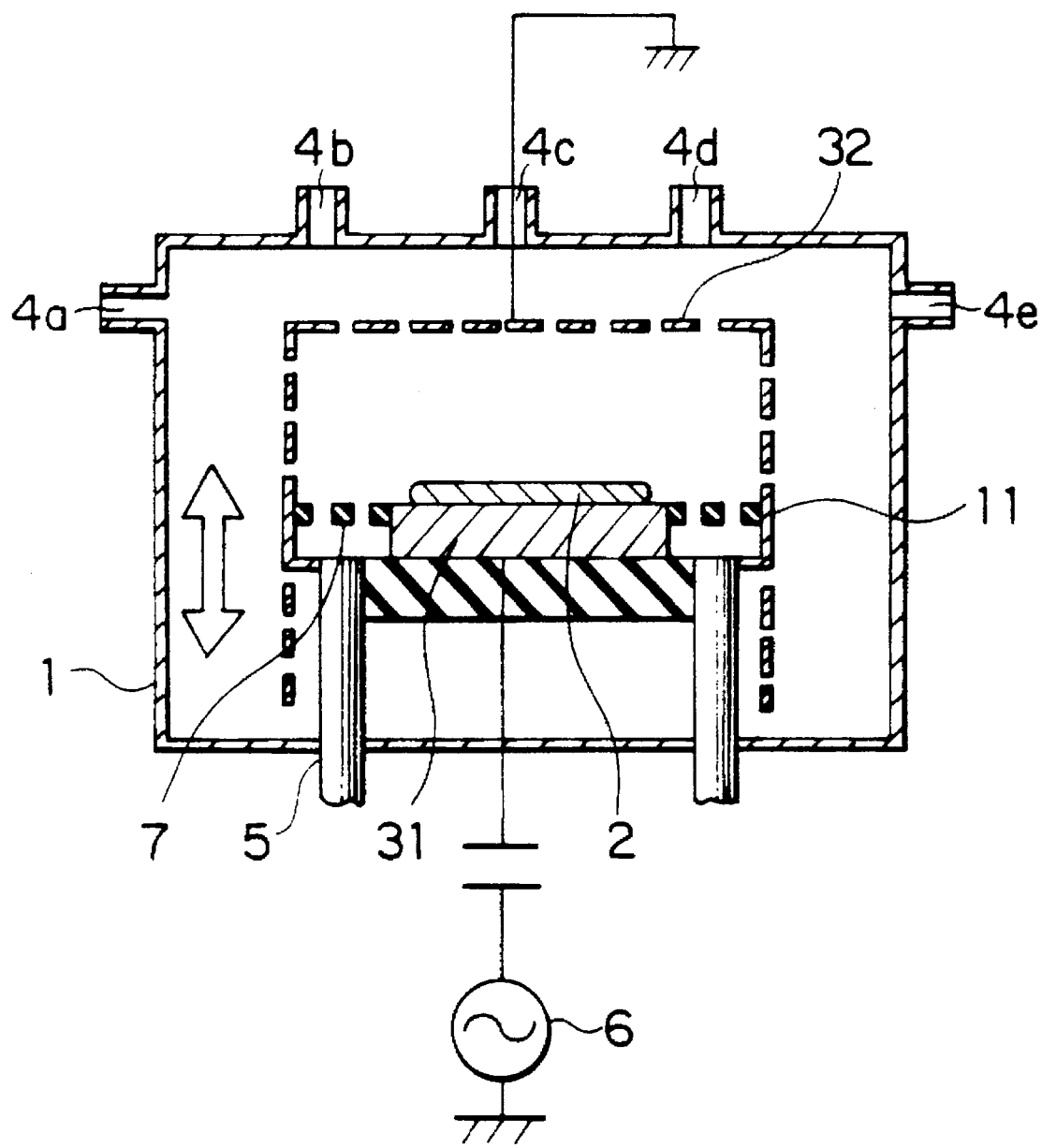
FIG. 6 is a cross-sectional view illustrating the third embodiment of the present invention.

FIG. 6 presents an exemplary cross-sectional view illustrating a plasma processing apparatus according to the third embodiment of this invention. This embodiment is the first embodiment (FIG. 4) which is added with a function of adjusting the distance between two electrodes. In this embodiment, a high-frequency electrode 31 on which a to-be-processed substrate 2 is to be placed, and an insulator 7 and an exhaust pipe 5 are designed to be movable together in the vertical direction. In other words, the relative positions of the ground electrode 31, insulator 7 and exhaust pipe 5 to the container 11 can be adjusted, thereby allowing the distance between the electrodes 31 and 32 to be adjusted. The insulator 7 shields the spaces between the lower side walls of the electrode 32 and the electrode 31 to trap plasma in the container 11. This embodiment has such an advantage as to be able to adjust the distance between the electrodes in addition to the advantages of the first embodiment.

What is claimed is:

1. A plasma processing apparatus comprising:
   a first container having a gas intake portion and a gas exhaust portion;
   a second container disposed within said first container and having a plurality of holes for permeability, said holes having diameters equal to or less than two times a sheath length of plasma to be produced;
   a first electrode constituting a part of said second container, an object to be processed being placed on said first electrode; and
   voltage applying means for applying a high-frequency voltage between said first electrode and said second container.

2. The plasma processing apparatus according to claim 1, wherein said voltage applying means has a high-frequency power supply for applying a high-frequency voltage to said first electrode, and grounding means for grounding said second container.

3. The plasma processing apparatus according to claim 1, wherein said first electrode and said second container are insulated from each other by an insulator.

4. The plasma processing apparatus according to claim 1, wherein said first electrode and said second container can change relative positions.

5. The plasma processing apparatus according to claim 3, wherein relative positions of said first electrode and said insulator to said second container are changeable.

6. A plasma processing apparatus comprising:
   a first container having a gas intake portion and a gas exhaust portion;
   a second container disposed within said first container and having a plurality of holes for permeability;
   a first electrode constituting a part of said second container, an object to be processed being placed on said first electrode,
   a hollow electrode and a cylindrical electrode surrounding said hollow electrode, disposed in said first container in contact with said second container and insulated from each other by an insulator, a negative voltage being applied to said hollow electrode; and voltage applying means for applying a high-frequency voltage between said first electrode and said second container.

7. The plasma processing apparatus according to claim 6, wherein said cylindrical electrode and said second container are fixed via an insulator.

8. The plasma processing apparatus according to claim 6, wherein said insulator also has a hole formed therein.

9. A plasma processing apparatus comprising:

a first container having a gas intake portion and a gas exhaust portion;

a second container having a top surface, side surfaces, and a bottom surface, said second container disposed within said first container and having a plurality of holes for permeability in each of said surfaces, said top surface and said side surfaces being conductive and constituting a first electrode;

a second electrode constituting a center part of said bottom surface and an insulator constituting an outer part of said bottom surface and having holes for permeability, said insulator formed between said second electrode and said side surfaces of said second container to insulate said first electrode from said second electrode; and voltage applying means for applying a high-frequency voltage between said first electrode and said second electrode.

10. The plasma processing apparatus according to claim 9, wherein said holes have diameters equal to or less than two times a sheath length of plasma to be produced.

11. The plasma processing apparatus according to claim 9, wherein said voltage applying means has a high-frequency power supply for applying a high-frequency voltage to said second electrode, and grounding means for grounding said first electrode.

12. The plasma processing apparatus according to claim 9, wherein said first electrode and said second container can change relative positions.

* * * * *